(12) United States Patent
Schulze et al.

(10) Patent No.: US 6,924,177 B2
(45) Date of Patent: Aug. 2, 2005

(54) METHOD FOR PRODUCING A THYRISTOR

(75) Inventors: Hans-Joachim Schulze, Ottobrunn (DE); Daniel Reznik, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/744,741

(22) Filed: Dec. 22, 2003

(65) Prior Publication Data

US 2004/0137665 A1 Jul. 15, 2004

Related U.S. Application Data

(62) Division of application No. 09/517,297, filed on Mar. 2, 2000, now abandoned.

(30) Foreign Application Priority Data

Mar. 2, 1999 (DE) .......................... 199 09 105

(51) Int. Cl.[7] ............................................. H01L 21/332
(52) U.S. Cl. ..................... 438/133; 438/138; 438/139
(58) Field of Search ................... 438/133, 138, 438/459, 202, 283, 455, 139, 798

(56) References Cited

U.S. PATENT DOCUMENTS

| | | | |
|---|---|---|---|
| 3,538,401 A | | 11/1970 | Chu |
| 3,855,611 A | * | 12/1974 | Neilson et al. .............. 257/129 |
| 4,980,742 A | | 12/1990 | Stengl et al. |
| 4,985,741 A | * | 1/1991 | Bauer et al. ................. 257/142 |
| 5,068,704 A | * | 11/1991 | Nakagawa et al. .......... 257/163 |
| 5,459,338 A | | 10/1995 | Takayanagi et al. |
| 5,506,153 A | * | 4/1996 | Brunner et al. .............. 438/133 |
| 5,629,535 A | * | 5/1997 | Ajit ............................. 257/120 |
| 5,844,259 A | * | 12/1998 | Kinzer et al. ................ 257/147 |
| 6,194,290 B1 | * | 2/2001 | Kub et al. ................... 438/455 |
| 6,274,892 B1 | * | 8/2001 | Kub et al. ................... 257/131 |
| 6,309,920 B1 | * | 10/2001 | Laska et al. ................. 438/202 |
| 6,404,037 B1 | * | 6/2002 | Finney ........................ 257/583 |
| 6,489,187 B2 | * | 12/2002 | Schulze et al. .............. 438/133 |
| 6,514,824 B1 | * | 2/2003 | Randazzo et al. ........... 438/283 |
| 6,555,849 B1 | * | 4/2003 | Schuh et al. ................. 257/130 |
| 6,630,711 B2 | * | 10/2003 | Huang ......................... 257/329 |
| 6,647,041 B1 | * | 11/2003 | Verma et al. ................. 372/45 |
| 6,703,684 B2 | * | 3/2004 | Udrea et al. ................. 257/548 |

FOREIGN PATENT DOCUMENTS

| | | |
|---|---|---|
| DE | 1 917 013 | 10/1969 |
| DE | 197 31 495 A1 | 1/1999 |
| EP | 0 158 186 A2 | 10/1985 |
| EP | 0 344 514 A2 | 12/1989 |
| EP | 0 387 721 A2 | 9/1990 |
| EP | 0 405 200 A1 | 1/1991 |
| EP | 0 556 739 A1 | 8/1993 |
| JP | 62-290179 | 12/1987 |
| JP | 08-032049 | 2/1996 |

* cited by examiner

*Primary Examiner*—Michael Lebentritt
*Assistant Examiner*—Walter L. Lindsay, Jr.
(74) *Attorney, Agent, or Firm*—Laurence A. Greenberg; Werner H. Stemer; Ralph E. Locher

(57) ABSTRACT

A thyristor having a first zone, a second zone, a third zone, and a fourth zone. At least one control electrode is connected to the second and/or third zone. In order to reduce the static and dynamic power loss in a symmetrical thyristor, it is proposed that a field stop zone of the second conductivity type be disposed approximately in the center of the second zone, with the result that it subdivides the second zone into two sections of essentially the same size. To that end, the field stop layer is produced on an inner surface of a first wafer or of a second wafer, and the first wafer is connected to the second wafer, such that the two inner surfaces of the two wafers lie one on top of the other.

2 Claims, 1 Drawing Sheet

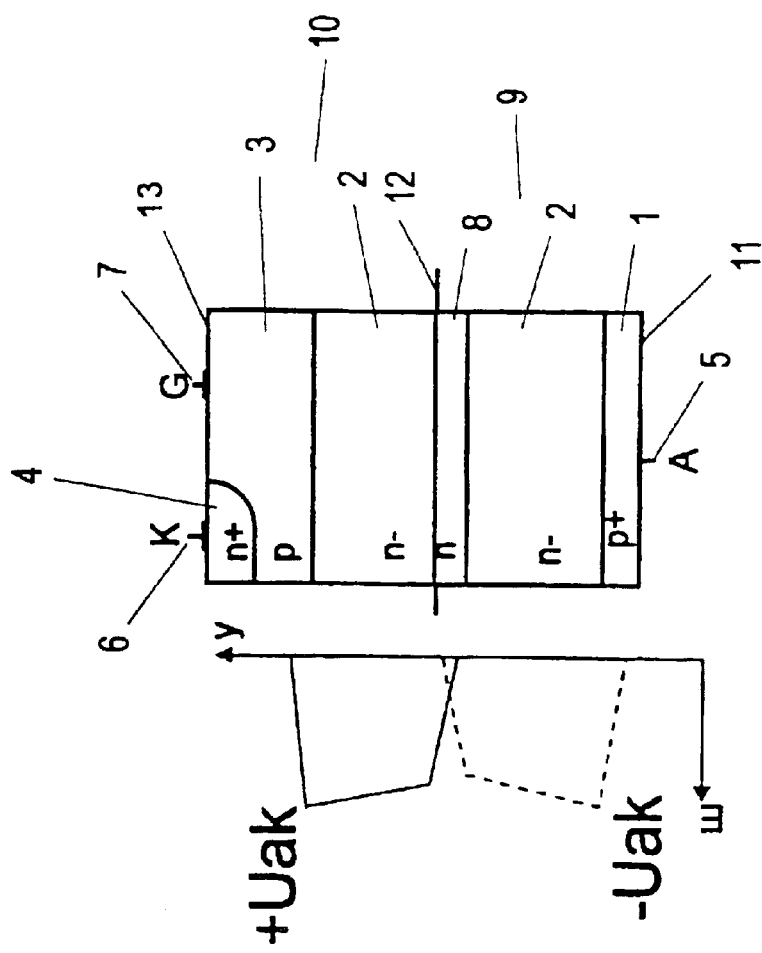
FIG. 1
FIG. 2
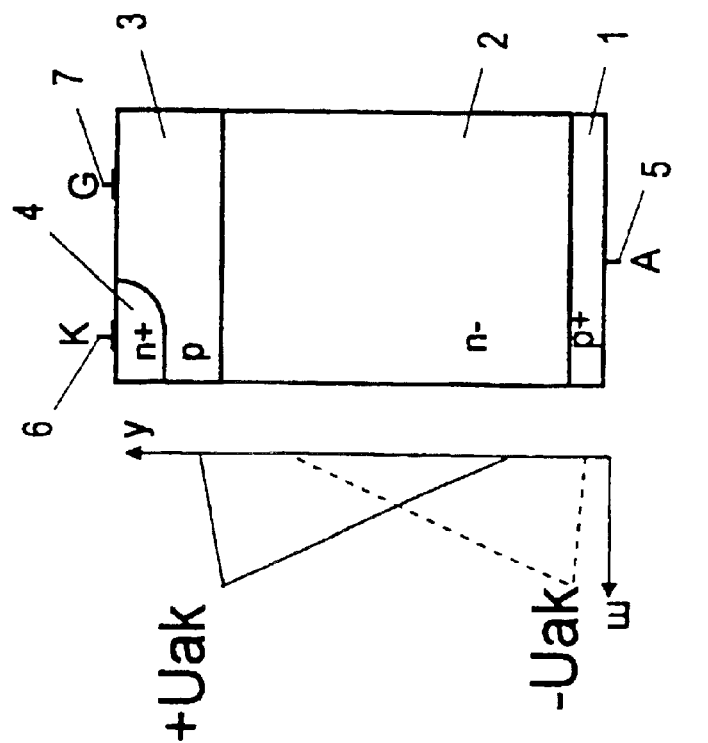
FIG. 3
Prior Art
FIG. 4
Prior Art

METHOD FOR PRODUCING A THYRISTOR

CROSS-REFERENCE TO RELATED APPLICATION

This application is a divisional of the U.S. application Ser. No. 09/517,297, filed Mar. 2, 2000 now abandoned.

BACKGROUND OF THE INVENTION

Field of the Invention

The invention relates to a method for producing a thyristor. In particular, the invention relates to a thyristor having a first zone of a first conductivity type which serves as an anode, a second zone of a second conductivity type which serves as a base, a third zone of the first conductivity type, and a fourth zone of the second conductivity type which serves as a cathode. The first and the fourth zones are doped more heavily than the second and third zones, respectively, and at least one control electrode is connected to the third zone.

Thyristors must have a minimum thickness depending on the blocking capability; the thickness can become very large in the case of thyristors with a high blocking capability. A large thickness of the component has the disadvantage that the total power loss of the component increases. Therefore, the costs for the operation of the instruments and apparatuses in which the thyristors are used increase, e.g. on account of additional circuitry outlay. Therefore, many users prefer a series circuit with a plurality of thyristors having a low blocking capability, in order to keep the thickness of the individual components and hence the power loss thereof as small as possible. However, the sometimes large number of thyristors having a low blocking capability which have to be connected in series and are intended to replace a thyristor having a high blocking performance has an adverse effect on the reliability of the overall system.

Moreover, asymmetrical thyristors do not provide a solution here. Although the thickness of asymmetrical thyristors is significantly less than that of symmetrical thyristors, asymmetrical thyristors are not suitable if high reverse blocking capabilities are required.

SUMMARY OF THE INVENTION

It is accordingly an object of the invention to provide a method for producing a thyristor which overcomes the above-mentioned disadvantages of the prior art methods of this general type, in which the thyristor has a reduced static and dynamic power loss.

With the foregoing and other objects in view there is provided, in accordance with the invention, a thyristor, including:

a first zone of a first conductivity type serving as an anode;

a second zone of a second conductivity type serving as a base and disposed next to the first zone, the second zone having a field stop zone of the second conductivity type disposed approximately in a center of the second zone, with a result that the field stop zone subdivides the second zone into two sections, including a first halve section and a second halve section, of substantially equal size;

a third zone of the first conductivity type disposed next to the second zone;

a fourth zone of the second conductivity type serving as a cathode and disposed next to the third zone, the first zone and the fourth zone being doped more heavily than the second zone and the third zone, respectively; and at least one control electrode connected to the third zone.

The way in which the above object is achieved is based on integrating the field stop zone approximately at half the depth of the base of symmetrically blocking thyristors, which field stop zone allows the use of silicon substrate materials with the lowest possible basic doping. The production of such a thyristor structure can be carried out in a particularly advantageous manner by connection of two wafers (wafer bonding).

The field stop zone is doped more heavily than the second zone (surrounding it). In this case, the field stop zone is doped, in particular, in such a way as to prevent penetration of the space charge zone from one half of the n⁻-type base into another half of the n⁻type base.

The method for producing a thyristor has the steps of: producing the first zone of the first conductivity type which serves as the anode, producing the second zone of the second conductivity type which serves as a base, producing the third zone of the first conductivity type, and producing the fourth zone of the second conductivity type which serves as the cathode. The first zone and a first section of the second zone are produced on a first wafer and the third zone and the fourth zone and also a second section of the second zone are produced on a second wafer. A field stop layer is produced in a region at an inner surface of the first wafer or of the second wafer, and the first wafer is connected to the second wafer by a so-called wafer bonding method, such that the two inner surfaces of the two wafers lie one on top of the other.

The field stop zone is preferably produced by ion implantation of a layer on an inner surface of one of the two wafers, and the implanted atoms are electrically activated and possibly indifussed by a subsequent thermal treatment. The ion implantation is carried out, in the course of the production process, in particular with an ion dose of from $10^{12}$ cm$^{-2}$ to $10^{13}$ cm$^{-2}$.

One advantage of the field distribution resulting from the field stop zone is that it is possible to dispense with the additional neutral zone required in symmetrical thyristors. The field profile in the base zone is restricted to one section of the base zone, with the result that the other section of the base zone forms a neutral zone which, according to the invention, has a vertical extent of approximately half the thickness of the base zone. This significantly reduces the partial transistor gain factor $\alpha_{pnp}$ compared with conventional dimensioning and thus increases the blocking capability of the thyristor to the same degree.

Other features which are considered as characteristic for the invention are set forth in the appended claims.

Although the invention is illustrated and described herein as embodied in a method for producing a thyristor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a structure of an embodiment of a symmetrical thyristor according to the invention;

FIG. 2 is a graph showing a field profile of the thyristor according to FIG. 1;

FIG. 3 is a sectional view of a prior art symmetrical thyristor; and

FIG. 4 is a graph showing the field profile of the thyristor according to FIG. 3.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a thyristor with four layers having a first zone 1 of a first conductivity type, which serves as an anode. In the embodiment shown, the first zone 1 is p-doped by the first conductivity type. Adjoining the first zone 1 is a second zone 2, which is of a second conductivity type. The second zone 2 serves as a base of the thyristor. The second conductivity type is opposite to the first conductivity type, with the result that the second zone 2 is n-doped in the embodiment shown. The second zone 2 is followed by a third zone 3, which is again of the first conductivity type, that is to say is p-doped in the embodiment according to FIG. 1. Finally, the third zone 3 is followed by a fourth zone 4, which is of the second conductivity type and serves as a cathode of the thyristor.

Consequently, three pn junctions are produced, namely between the first and second zones 1 and 2, and between the second and third zones 2 and 3, and, finally, between the third and fourth zones 3 and 4. In this case, the first and fourth zones 1 and 4, respectively, are each doped more heavily than the second and third zones 2 and 3, respectively.

An anode terminal 5 on the first, p-doped zone 1 and a cathode terminal 6 on the fourth, n-doped zone 4 are provided as the terminals of the thyristor. The triggering behavior of the thyristor is controlled by at least one control electrode 7 connected to the third zone 3.

Since, as already described above, the thickness of symmetrical thyristors can become very large depending on the blocking capability, the total power loss of the component increases sometimes to the same degree. In order to reduce the static and dynamic power loss of a symmetrical thyristor, the thyristor according to the invention contains a field stop zone 8 of the second conductivity type. The field stop zone 8 is thus of the same conductivity type as the second zone 2 surrounding it, that is to say it is n-doped. It is preferable, however, for it to be doped more heavily than the second zone 2: whereas the second zone 2 is n$^-$-doped, the field stop zone 8 is n-doped. The field stop zone 8 is disposed approximately in the center of the second zone 2, with the result that the second zone 2 is subdivided into two sections which are of essentially the same size and lie one on the other. A field profile is thereby achieved in the second zone 2, including the field stop zone 8, which is symmetrical in the case of forward-blocking and reverse-blocking thyristors. Therefore, the blocking capability of the thyristor is approximately identical in the forward direction and in the reverse direction.

The field profile of the thyristor is shown in FIG. 2 both for the forward-blocking thyristor and the reverse-blocking thyristor. A distance from the anode or cathode of the thyristor is illustrated in the vertical direction, and a field strength in the thyristor is illustrated in the horizontal direction. The field profile in the forward direction is illustrated by a solid line, and the field profile in the reverse direction is illustrated by a broken line. As can be gathered from FIG. 2, the field rises steeply within the n-doped field stop zone 8, increases less steeply in one section of the n$^-$-doped base zone 2, and then falls steeply again in the adjoining p-type or p$^+$-type zone, respectively. In this case, the doping of the field stop zone 8 is preferably chosen such that it just suffices to prevent penetration of the space charge zone into the other half of the n$^-$-type base 2.

The benefit that can be gained from this field distribution is that it is possible to dispense with the neutral zone that has to be additionally provided in symmetrical thyristors, in order to avoid the so-called punch-through effect at high voltage. Since this additional neutral zone can reach a thickness of approximately 100 to 150 $\mu$m, it makes a substantial contribution to the undesired thickness of the component.

FIG. 3 and FIG. 4 show (not true to scale), for comparison purposes, the structure and the vertical field profile in a symmetrical thyristor with conventional dimensioning. In this case, components identical to those in FIGS. 1 and 2, respectively, are provided with the same reference symbols. They will not be explained again below.

The thyristor in FIG. 3 is constructed similarly to the thyristor in FIG. 1, except that the field stop zone 8, which is an essential feature of the present invention, is lacking in the thyristor in FIG. 3.

The field profile, shown in FIG. 4, of this thyristor differs from the field profile according to FIG. 2 in the thyristor according to the invention, on account of the missing field stop zone 8. While the field profile in FIG. 2 is essentially trapezoidal, the field profile in FIG. 4 is triangular: the field rises within the base zone 2, reaches its maximum value at the pn junction with the neighboring p-type zone 1 or 3 (depending on whether the applied voltage is greater than or less than 0), and falls steeply in the neighboring p$^-$ or p$^+$-doped zone, respectively. As can be gathered from FIG. 4, almost the entire zone 2 (except for the above-mentioned neutral zone of approximately 100 to 150 $\mu$m) is taken up for the rise of the field in the base zone 2 in the case of the prior art. By contrast, according to FIG. 2, the field buildup remains restricted only to approximately half of the base zone 2 in the case of the thyristor according to the invention. The other half of the base zone 2 acts as a neutral zone in order to avoid the so-called punch-through effect at high voltage. Thus, in the blocking situation, as a result of the increased recombination in the thicker neutral zone (in thyristors the carrier lifetime is usually decreased homogeneously by application of electron irradiation in the vertical component direction), the partial transistor gain factor $\alpha_{pnp}$ is greatly reduced compared with conventional dimensioning, which in turn significantly increases the blocking capability of the proposed structure. This gain in the blocking capability can be utilized to further reduce the component thickness and thus also to further decrease the power loss of the thyristor.

The method according to the invention for producing a thyristor according to the invention as shown in FIG. 1 and having the field profile as shown in FIG. 2 is explained below.

In a first step of the method for producing thyristors, the following are produced: the first zone 1, which is of a first conductivity type, the second zone 2, which is of a second conductivity type opposite to the first conductivity type, the third zone 3 of the first conductivity type, and the fourth zone 4 of the second conductivity type. The first zone 1 serves as an anode of the thyristor and the fourth zone 4 serves as a cathode.

In the production methods of the prior art, a wafer was used for this purpose. In the method according to the invention, by contrast, the first zone 1 and a first section of the second zone 2 are produced on a first wafer 9, while the third zone 3, the fourth zone 4 and also a second section of the second zone 2 are produced on a second wafer 10. In order to produce the two zones 1, and 3 and 4, use is preferably made of a first and second, in each case n⁻-doped, wafer 9 and 10, respectively. The first zone 1 is produced on an outer surface 11 of the wafer 9; the two zones 3 and 4 are produced on an outer surface 13 of the wafer 10. Here and below, "outer" surface 11, 13 is understood to be a surface which remains freely accessible even after the bonding of the wafer. In contrast to this, an "inner" surface 12 of a wafer is a surface that is no longer freely accessible after the bonding of the two wafers. The n⁻-doped wafer 9 or 10 forms the first or second section, respectively, of the subsequent base zone 2 of the thyristor.

After the above production steps for the thyristor according to the invention, the four zones of the thyristor are obtained on the two wafers 9 and 10 and the base zone 2 of the thyristor is present in the form of two sections on the two wafers 9 and 10.

In a following step of the production method, the field stop zone 8 is then produced on the inner surface 12 of the first wafer 9 or of the second wafer 10 by a layer on one of the two inner surfaces 12 being n-doped with the dose required for the field stop zone 8. Examples of suitable atoms are phosphorus, sulfur or selenium. The field stop zone 8 is thus located directly at the inner surface 12 of one of the wafers 9 or 10. In FIG. 1, an interface between the first wafer 9 and the second wafer 10 is represented by an extension of the upper side of the field stop zone 8. The field stop zone 8 thus lies in the lower wafer 9. However, it is evident that the field stop zone 8 can be produced equally well in the upper wafer 10.

The first wafer 9 and the second wafer 10 are subsequently connected to one another by a so-called wafer bonding technique, such that the two inner surfaces 12 of the two wafers 9 and 10 lie one on top of the other. This completes the thyristor in its structure shown in FIG. 1.

The field stop zone 8 can be produced by ion implantation, in particular. In order, as mentioned-above, to prevent penetration of the space charge zone into the other half of the n⁻-type base 2 and to set the doping of the field stop zone 8 in such a way that it is just sufficient for this purpose, an ion dose of from $10^{12}$ cm$^{-2}$ to $10^{13}$ cm$^{-2}$ is used in the course of the production of the component. In the course of the production of the field stop zone 8 by ion implantation, the implanted atoms are subsequently electrically activated and possibly in diffused by a thermal treatment. In general, a degree of in diffusion of the implanted atoms also takes place in this case (e.g. to a depth of 10 μm).

We claim:

1. A method for producing a thyristor which comprises:

providing a first wafer and a second wafer;

producing a first zone of a first conductivity type serving as an anode on the first wafer;

producing a first section of a second zone of a second conductivity type serving as a base on the first wafer;

producing a second section of the second zone of the second conductivity type serving as the base on the second wafer;

producing a third zone of the first conductivity type on the second wafer;

producing a fourth zone of the second conductivity type serving as a cathode on the second wafer;

producing a field stop layer in the second zone of the second conductivity type in a region at an inner surface of one of the first wafer and the second wafer;

connecting the first wafer to the second wafer such that the inner surface of the first wafer and the inner surface of the second wafer lie one on top of another; and producing the field stop zone by ion implantation with an ion dose of from $10^{12}$ cm$^{-2}$ to $10^{13}$ cm$^{-2}$ into a layer in a region at the inner surface of one of the first wafer and the second wafer and implanted atoms are electrically activated by a subsequent thermal treatment.

2. The method according to claim 1, which comprises indiffusing the implanted atoms with the subsequent thermal treatment.

* * * * *